(12) United States Patent
Lakshmipathy et al.

(10) Patent No.: US 8,990,648 B2
(45) Date of Patent: Mar. 24, 2015

(54) OPTIMIZED SYNCHRONOUS SCAN FLIP FLOP CIRCUIT

(75) Inventors: Ravi Lakshmipathy, Bangalore (IN); Balaji Upputuri, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 429 days.

(21) Appl. No.: 13/432,004

(22) Filed: Mar. 28, 2012

(65) Prior Publication Data

US 2013/0262943 A1    Oct. 3, 2013

(51) Int. Cl.
  *G01R 31/28* (2006.01)
  *G06F 11/00* (2006.01)
  *G01R 31/3187* (2006.01)
  *G01R 31/3185* (2006.01)
  *G01R 31/3177* (2006.01)
  *G06F 11/26* (2006.01)
  *G11C 29/32* (2006.01)

(52) U.S. Cl.
  CPC ..... *G01R 31/318541* (2013.01); *G01R 31/318544* (2013.01); *G01R 31/318555* (2013.01); *G01R 31/318511* (2013.01); *G01R 31/318533* (2013.01); *G01R 31/3187* (2013.01); *G01R 31/3177* (2013.01); *G01R 31/318536* (2013.01); *G06F 11/26* (2013.01); *G11C 29/32* (2013.01); *G01R 31/2851* (2013.01)
  USPC ........... 714/726; 714/729; 714/731; 714/727; 714/724; 714/742; 324/750.3

(58) Field of Classification Search
  CPC .............. G01R 31/318541; G01R 31/318555; G01R 31/318544; G01R 31/318511; G01R 31/318533; G01R 31/318536; G01R 31/3177; G01R 31/3187; G01R 31/2851; G06F 11/26; G11C 29/32

USPC ................. 714/726, 729, 731, 727, 724, 742; 324/750.3

See application file for complete search history.

(56) References Cited

U.S. PATENT DOCUMENTS

| | | | |
|---|---|---|---|
| 5,881,067 A | 3/1999 | Narayanan et al. | |
| 5,898,702 A * | 4/1999 | Narayanan et al. | ........... 714/726 |
| 6,205,566 B1 * | 3/2001 | Takeoka | ........................ 714/726 |
| 6,393,592 B1 | 5/2002 | Peeters et al. | |

(Continued)

OTHER PUBLICATIONS

Arora, M., The Art and Hardware Architecture Design Methods and Techniques for Digital Circuits, 2012, Springer, pp. 11-49.*

(Continued)

*Primary Examiner* — John J Tabone, Jr.
(74) *Attorney, Agent, or Firm* — Joseph Petrokaitis; L. Jeffrey Kelly

(57) ABSTRACT

According to at least one exemplary embodiment, a synchronous active high reset scan flip flop is provided. The synchronous active high reset scan flip flop may include a data input, a serial input, a test enable input, a reset input, a clock input, a device output. It may also include an AND gate configured to receive the serial input and the test enable input and a multiplexer configured to receive the data input and a first output signal received from the AND gate. The multiplexer is operable in response to the reset input which is used to reset the flip flop in function mode, and permit scan test in test mode. The synchronous active high reset scan flip flop may also include a storage element configured to receive a second output signal received from the multiplexer and operable in response to a clock signal received from the clock input.

12 Claims, 4 Drawing Sheets

(56) References Cited

U.S. PATENT DOCUMENTS

| | | |
|---|---|---|
| 6,779,143 B2 | 8/2004 | Grisenthwaite |
| 6,785,855 B2 * | 8/2004 | Zhang et al. .................. 714/731 |
| 6,970,815 B1 * | 11/2005 | Bombal et al. .................. 703/15 |
| 7,154,317 B2 | 12/2006 | Flynn et al. |
| 7,188,285 B2 * | 3/2007 | Natsume ....................... 714/727 |
| 7,590,900 B2 * | 9/2009 | Kim et al. ..................... 714/724 |
| 7,761,759 B2 * | 7/2010 | Yamazaki ..................... 714/726 |
| 2003/0093734 A1 * | 5/2003 | Zhang et al. .................. 714/731 |
| 2009/0309641 A1 | 12/2009 | Park |
| 2012/0166900 A1 * | 6/2012 | Dimri ........................... 714/726 |

OTHER PUBLICATIONS

Narayanan et al., "An Efficient Scheme to Diagnose Scan Chains", Sun Microsystem Inc. Mountain View, CA, 1997 IEEE, pp. 704-713.

* cited by examiner

| CK | Inputs | | | Output |
|---|---|---|---|---|
| | D | R | SI | TE | Q |
| R | -- | 1 | -- | 0 | 0 |
| R | -- | 1 | -- | 1 | SI |
| R | -- | 0 | -- | 0 | D |
| R | -- | 0 | -- | 1 | D |

FIG. 4

| CK | Inputs | | | Output |
|---|---|---|---|---|
| | D | R | SI | TE | Q |
| R | -- | 0 | -- | 0 | 0 |
| R | -- | 0 | -- | 1 | SI |
| R | -- | 1 | -- | 0 | D |
| R | -- | 1 | -- | 1 | D |

FIG. 5

OPTIMIZED SYNCHRONOUS SCAN FLIP FLOP CIRCUIT

BACKGROUND OF THE INVENTION a. Field of the Invention

The present invention generally relates to integrated circuits. More specifically, this invention relates to scan flip flop architecture used in test and functional modes of operation.

b. Description of the Related Art

There exists an ever increasing demand for faster and more complex integrated circuits (IC). Further, ICs today incorporate large numbers of scan flip flop circuitry. Testing of ICs, both combinational and sequential logic after fabrication is a crucial step in the manufacturing process to ensure performance and reliability.

A synchronous scan flip flop 360 includes a data input 368, a reset input 370, a serial input 372, a scan enable input 374, a clock input 376, and a device output 378. In addition, the synchronous scan flip flop 360 includes an inverter 384, a logic gate 362, a multiplexer 364, and a storage element 366. The inverter 384 changes an input's logic state from logic 0 to logic 1 or from logic 1 to logic 0. The logic gate 362 receives a signal from the data input 368 and the reset input 370. The data input 368 and reset input 370 are used during functional mode. The multiplexer 364 receives the first output 380 from the logic gate 362, the serial input 372, and the scan enable input 374. The serial input 372 is used to input a serial input sequence during test mode or scan shift mode of operation. Therefore, the multiplexer 364, according to the scan enable input 374, will select either a functional mode input sequence (output of the AND gate) or a serial input sequence. The storage element 366 receives the second output 382 from the multiplexer 364 and a clock signal 376. The storage element 366 will transmit the second output 382 of the multiplexer 366 to the device output 378 upon a rising edge or a falling edge of the clock signal 376 depending on the active edge of clock.

In functional mode the scan enable input 374 is de-asserted and has a logic 0 state causing the multiplexer 364 to select the first output 380 of the logic gate 362. Under functional non-reset operation the reset input 370 will have a logic 0 state and the first output 380 of the AND gate 364 will be equal to the data input 368 irrespective of the logic state of the serial input 372. Thus, the device output 378 will be equal to the data input 368. To reset the synchronous scan flip flop 360, the reset input 370 is asserted or has a logic 1 state. The inverter 384 converts the logic 1 state from the reset input 370 to a logic 0 state causing the first output 380 of the logic gate 362 to have a logic 0 state. Therefore, whenever the reset input 370 is asserted in functional mode the device output 378 will have a logic 0 state. The synchronous scan flip flop 360 can only be reset in functional mode.

Test mode generally refers to global testing of the IC in which the synchronous scan flip flop 360 is included. Included in test mode is scan mode where the combinational and sequential circuits are tested. Both test mode and scan mode permit manufactures to test the integrity of the final assembly. Testing of scan flip flop includes selecting test mode, providing testing inputs, and finally comparing the serial input sequence response with an expected output. In test mode, the serial input sequence is provided at the serial input 372. Upon assertion of a global testing sequence the scan enable input 374 is asserted, or has a logic state, causing the second output 382 of the multiplexer 364 to be equal to the serial input 372. Therefore, the device output 378 is equal to the serial input 372 or the serial input sequence.

The inventors have recognized advantages by eliminating the inverter 384. One being a reduction in the scan flip flop area. Reducing the size of the scan flip flop allows for a substantial reduction in the overall size of an IC including several scan flip flops. Another advantage recognized by the inventors is a reduction in logic gate delay on the data path in turn improving data transfer rates while operating in functional mode.

SUMMARY

According to at least one exemplary embodiment, a synchronous active high reset scan flip flop is provided. The synchronous active high reset scan flip flop may include a data input, a serial input, a test enable input, a reset input, a clock input, a device output. The synchronous active high reset scan flip flop may also include an AND gate configured to receive the serial input and the test enable input and a multiplexer configured to receive the data input and a first output signal received from the AND gate. The multiplexer is operable in response to the reset input. The reset input being used to reset the flip flop in function mode, and permit scan test in test mode. The synchronous active high reset scan flip flop may also include a storage element configured to receive a second output signal received from the multiplexer and operable in response to a clock signal received from the clock input.

According to another exemplary embodiment, a synchronous active low reset scan flip flop is provided. The synchronous active low reset scan flip flop may include a data input, a serial input, a test enable input, a reset input, a clock input, a device output. The synchronous active low reset scan flip flop may also include an AND gate configured to receive the serial input and the test enable input and a multiplexer configured to receive the data input and a first output signal received from the AND gate. The multiplexer is operable in response to the reset input. The reset input being used to reset the flip flop in function mode, and permit scan test in test mode. The synchronous active low reset scan flip flop may also include a storage element configured to receive a second output signal received from the multiplexer and operable in response to a clock signal received from the clock input.

According to another exemplary embodiment a method of resetting a synchronous active high reset scan flip flop is provided. The method including de-asserting a test enable input, wherein a serial input and a logic 0 state of the test enable input are received by an AND gate causing the product of the AND gate to be a logic 0 state. The product of the AND gate is received by a multiplexer. The method also including asserting a reset input received by the multiplexer causing the multiplexer to transmit the logic 0 state from the AND gate to a storage element where upon the receipt of a clock signal the storage element transmits the logic 0 state to a device output.

According to another exemplary embodiment a method of resetting a synchronous active low reset scan flip flop is provided. The method including de-asserting a test enable input, wherein a serial input and a logic 0 state of the test enable input are received by an AND gate causing the product of the AND gate to be a logic 0 state. The product of the AND gate is received by a multiplexer. The method also including de-asserting a reset input received by the multiplexer causing the multiplexer to transmit the logic 0 state from the AND gate to a storage element where upon the receipt of a clock signal the storage element transmits the logic 0 state to a device output.

According to another exemplary embodiment a method of testing a synchronous active high reset scan flip flop is provided. The method including asserting a test enable input, wherein a serial input and the logic 1 state of the test enable input are received by an AND gate causing the product of an AND gate to equal the serial input. The product of the AND gate is received by a multiplexer. The method also including asserting a reset input received by the multiplexer causing the multiplexer to transmit the product of the AND gate to a storage element where upon the receipt of a clock signal the storage element transmits the product of the AND gate to a device output.

According to another exemplary embodiment a method of testing a synchronous active low reset scan flip flop is provided. The method including asserting a test enable input, wherein a serial input and the logic 1 state of the test enable input are received by an AND gate causing the product of an AND gate to equal the serial input. The product of the AND gate is received by a multiplexer. The method also including de-asserting a reset input received by the multiplexer causing the multiplexer to transmit the product of the AND gate to a storage element where upon the receipt of a clock signal the storage element transmits the product of the AND gate to a device output.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIG. 4 illustrates a truth table for the synchronous active high reset scan flip flop show in FIG. 1.

FIG. 5 illustrates a truth table for the synchronous active low reset scan flip flop show in FIG. 1.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be modified in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessary obscuring the presented embodiments.

Embodiments of the present invention provide for the use of a single input for resetting and testing a scan flip flop. Any signal or input that is asserted has a logic state of 1. Any signal or input that is de-asserted has a logic state of 0. Active high reset refers to a reset input of logic 1. Active low reset refers to a reset input of logic 0.

Figure 1:
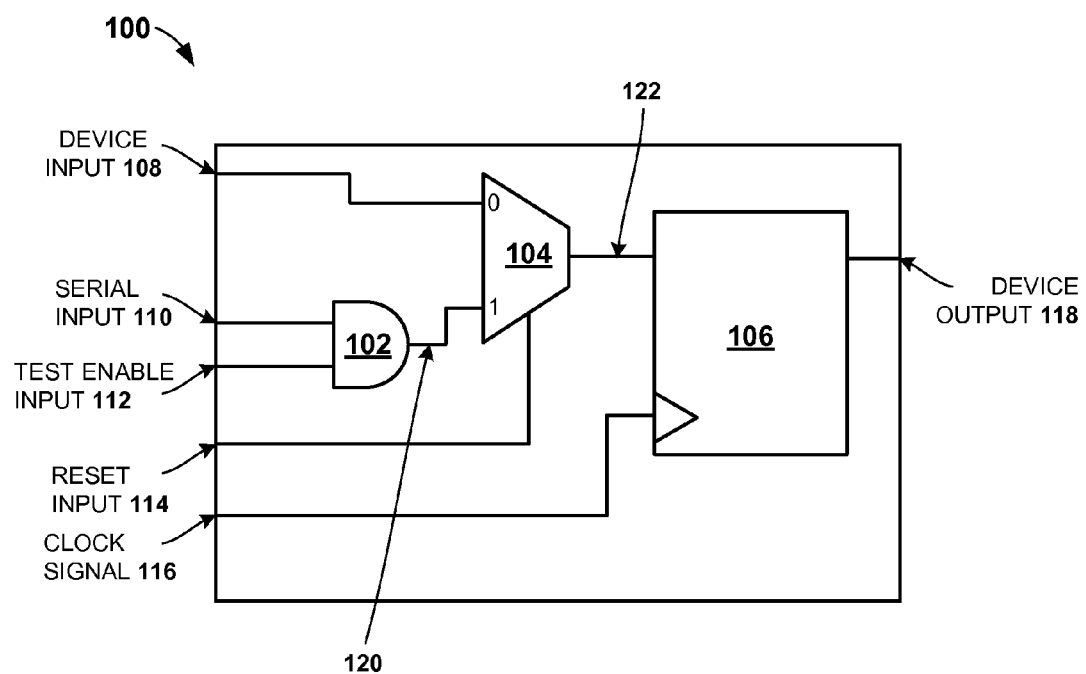
FIG. 1 illustrates s a schematic representation of a synchronous active high reset scan flip flop according to one embodiment.

FIG. 1 illustrates an active high reset scan flip flop 100 having an AND gate 102, a 2-to-1 multiplexer 104, and a storage element 106. The AND gate 102 includes two inputs and a first output 120. A serial input 110 and a test enable input 112 are connected to the input side of the AND gate 102. The multiplexer 104 includes three inputs and a second output 122. A device input 108, a reset input 114, and the first output 120 of the AND gate 102 are connected to the input side of the multiplexer 104. The storage element 106 includes two inputs and one output. The second output 122 of the multiplexer 104 and a clock signal 116 are connected to the input side of the storage element 106. The storage element 106 yields a device output 118.

The device input 108, the serial input 110, the test enable input 112, the reset input 114, and the clock signal 116 may have either a binary 0 logic state (logic 0) or a binary 1 logic state (logic 1). When the reset input 114 is logic 0, the device output 118 equals the device input 108. When the reset input 114 is logic 1, the device output 118 equals the first output 120 of the AND gate 102. When the active high reset scan flip flop 100 is reset a logic 0 state is desired at the device output 118. The storage element 106 stores the second output 122 of the multiplexer 104 and transmits the signal to the device output 118 upon the receipt of a clock signal 116.

The active high reset scan flip flop 100 may operate in either a functional mode or test mode. In functional mode the test enable input 112 has a logic 0 state, therefore causing the first output 120 of the AND gate 102 to be logic 0 for serial inputs 110 having logic 1 state and serial input 110 having a logic 0 state. Therefore, whenever the reset input 114 is asserted in functional mode, thus having a logic 1 state, the device output 118 will be equal to the first output 120 of the AND gate 102, or logic 0. The active high reset scan flip flop 100 is reset when the reset input 114 is asserted or logic 1 during functional mode.

In test mode the test enable input 112 has a logic 1 state, therefore causing the first output 120 of the AND gate 102 to be equal to the serial input 110. By asserting the reset input—logic 1—the second output 122 of the multiplexer 104 and therefore the device output 118 would be equal to the serial input 110. In test mode the reset input 114 functions as a scan enable input to select the serial input 110 over the device input 108 for testing purposes. A sequence of test data is provided at the serial input 110. The sequence of test data has an expected output which is compared to the device output 118 as a way of testing the active high reset scan flip flop 100. Therefore, the reset input 114 serves two functions depending on whether the active high reset scan flip flop 100 is in functional mode or test mode.

The active high reset scan flip flop 100 reduces the flip flop area by one inverter thus reducing the area of the scan flip flop. Because there is generally a large number of flip flops in a particular IC, the overall area of the IC can be significantly reduced by reducing the area of individual flip flops. Elimination of the inverter also improves the timing of the flip flop on the data path.

Figure 2:
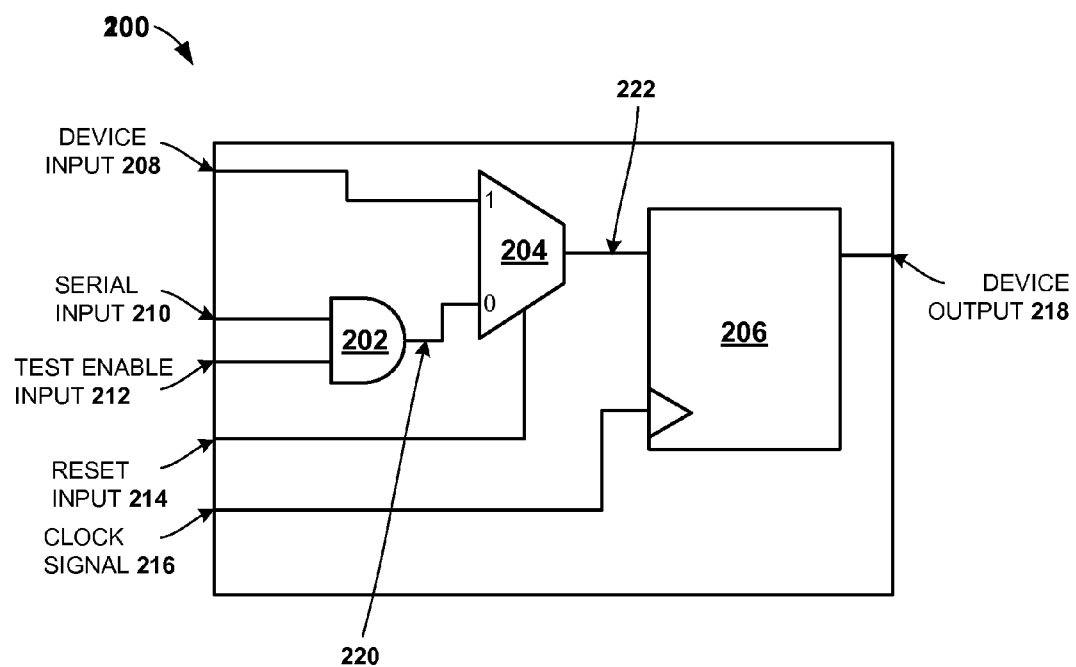
FIG. 2 illustrates a schematic representation of a synchronous active low reset scan flip flop according to one embodiment.
Figure 3:
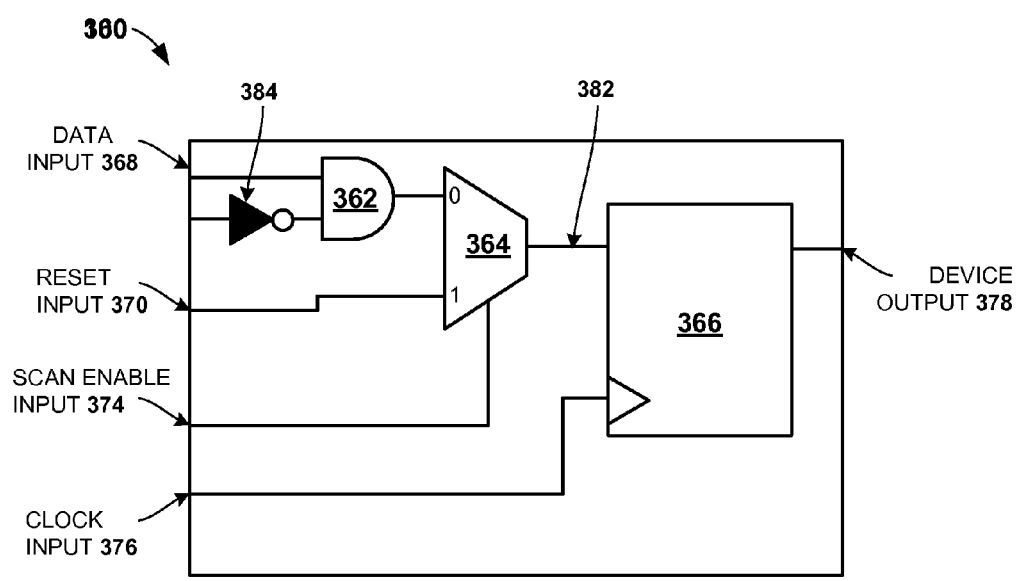
FIG. 3 illustrates a schematic representation of a synchronous scan flip flop according to the prior art.

FIG. 2 illustrates an active low reset scan flip flop 200 having an AND gate 202, a 2-to-1 multiplexer 204, and a storage element 206. The AND gate 202 includes two inputs and an output 220. A serial input 210 and a test enable input 212 are connected to the input side of the AND gate 202. The multiplexer 204 includes three inputs and an output 222. A device input 208, a reset input 214, and the output 220 of the AND gate 202 are connected to the input side of the multiplexer 204. The storage element 206 includes two inputs and one output. The output 222 of the multiplexer 204 and a clock signal 216 are connected to the input side of the storage element 206. The storage element 206 yields a device output 218.

The device input 208, the serial input 210, the test enable input 212, the reset input 214, and the clock signal input 216 may have either a binary 0 logic state (logic 0) or a binary 1 logic state (logic 1). When the reset input 214 is logic 1, the device output 218 equals the device input 208. When the reset input 214 is logic 0, the device output 218 equals the output 220 of the AND gate 202. When the active low reset scan flip flop 200 is reset a logic 0 state is desired at the device output 218. The storage element 206 stores the output 222 of the multiplexer 204 and transmits the signal to the device output 218 upon the receipt of a clock signal 216.

The active low reset scan flip flop 200 may operate in either a functional mode or test mode. In functional mode the test enable input 212 has a logic 0 state, therefore causing the output 220 of the AND gate 202 to be logic 0 for serial inputs 210 having logic 1 state and serial input 210 having a logic 0 state. Therefore, whenever the reset input 214 is de-asserted in functional mode, thus having a logic 0 state, the device output 218 will be equal to the output 220 of the AND gate 202, or logic 0. The active low reset scan flip flop 200 is reset when the reset input 214 is de-asserted or logic 0 during functional mode.

In test mode the test enable input 212 has a logic 1 state, therefore causing the output 220 of the AND gate 202 to be equal to the serial input 210. By de-asserting the reset input 214—logic 0—the output 222 of the multiplexer 204 and therefore the device output 218 would be equal to the serial input 210. In test mode the reset input 214 functions as a scan enable input to select the serial input 210 over the device input 208 for testing purposes. A sequence of test data is provided at the serial input 210. The sequence of test data has an expected output which is compared to the device output 218 as a way of testing the active low reset scan flip flop 200. Therefore, the reset input 214 serves two functions depending on whether the active low reset scan flip flop 200 is in functional mode or test mode.

FIG. 4 illustrates the truth table for the synchronous active high reset scan flip flop 100 in FIG. 1. The truth table in FIG. 4 explains the behavior of the synchronous active high reset scan flip flop 100 in both functional and test modes.

FIG. 5 illustrates the truth table for the synchronous active low reset active low reset scan flip flop 200 in FIG. 2. The truth table in FIG. 5 explains the behavior of the synchronous active low reset scan flip flop 200 in both functional and test modes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A synchronous active high reset scan flip flop comprising:
    a data input;
    a serial input;
    a test enable input;
    a reset input;
    a clock input;
    a device output;
    an AND gate configured to receive the serial input and the test enable input, and output a first output signal;
    a multiplexer configured to receive the data input, the first output signal, and the reset input, and output a second output signal comprising one of the data input or the first output signal in response to the reset input being de-asserted or asserted, respectively, the reset input is used to reset the flip flop in a function mode, and permit scan test in a test mode; and
    a storage element configured to receive the second output signal, and output a device output upon receipt of an active edge of a clock signal.

2. The synchronous active high reset scan flip flop of claim 1, wherein operating in the function mode the test enable input is de-asserted, the reset input is de-asserted, the data input is transmitted by the multiplexer to the storage element where upon receipt of the active edge of the clock signal the storage element transmits the data input to the device output.

3. The synchronous active high reset scan flip flop of claim 2, wherein the test enable input is de-asserted and the reset input is asserted, the AND gate generates a logic 0 state which is transmitted by the multiplexer to the storage element where upon receipt of the active edge of the clock signal the storage element transmits the logic 0 state to the device output.

4. The synchronous active high reset scan flip flop of claim 1, wherein operating in the test mode the test enable input is asserted, the reset input is asserted, the serial input toggles between a logic 0 state and a logic 1 state and is transmitted by the multiplexer to the storage element where upon receipt of the active edge of the clock signal the storage element transmits the serial input to the device output.

5. A synchronous active low reset scan flip flop comprising:
    a data input;
    a serial input;
    a test enable input;
    a reset input;
    a clock input;
    a device output;
    an AND gate configured to receive the serial input and the test enable input, and output a first output signal;
    a multiplexer configured to receive the data input, the first output signal, and the reset input, and output a second output signal comprising one of the data input or the first output signal in response to the reset input being asserted or de-asserted, respectively, the reset input is used to reset the flip flop in a function mode, and permit scan test in a test mode; and
    a storage element configured to receive the second output signal, and output a device output upon receipt of an active edge of a clock signal.

6. The synchronous active low reset scan flip flop of claim 5, wherein operating in the function mode the test enable input is de-asserted, the reset input is asserted, the data input is transmitted by the multiplexer to the storage element where upon receipt of the active edge of the clock signal the storage element transmits the data input to the device output.

7. The synchronous active low reset scan flip flop of claim 6, wherein the test enable input is de-asserted and the reset input is de-asserted, the AND gate generates a logic 0 state which is transmitted by the multiplexer to the storage element where upon receipt of the active edge of the clock signal the storage element transmits the logic 0 state to the device output.

8. The synchronous active low reset scan flip flop of claim 5, wherein operating in the test mode the test enable input is asserted, the reset input is de-asserted, the serial input toggles between a logic 0 state and a logic 1 state and is transmitted by the multiplexer to the storage element where upon receipt of the active edge of the clock signal the storage element transmits the serial input to the device output.

9. A method of resetting a synchronous active high reset scan flip flop, the method comprising:
de-asserting a test enable input, wherein a serial input and a logic 0 state of the test enable input are received by an AND gate, the AND gate having an output, and causing the output of the AND gate to be the logic 0 state, the output of the AND gate is received by a multiplexer; and
asserting a reset input received by the multiplexer causing the multiplexer to transmit the logic 0 state from the AND gate to a storage element where upon receiving an active edge of a clock signal the storage element transmits the logic 0 state to a device output.

10. A method of resetting a synchronous active low reset scan flip flop, the method comprising:
de-asserting a test enable input, wherein a serial input and a logic 0 state of the test enable input are received by an AND gate, the AND gate having an output, and causing the output of the AND gate to be the logic 0 state, the output of the AND gate is received by a multiplexer; and
de-asserting a reset input received by the multiplexer causing the multiplexer to transmit the logic 0 state from the AND gate to a storage element where upon receiving an active edge of a clock signal the storage element transmits the logic 0 state to a device output.

11. A method of testing a synchronous active high reset scan flip flop, the method comprising:
asserting a test enable input, wherein a serial input and a logic 1 state of the test enable input are received by an AND gate, the AND gate having an output, and causing the output of the AND gate to equal the serial input, the output of the AND gate is received by a multiplexer; and
asserting a reset input received by the multiplexer causing the multiplexer to transmit the output of the AND gate to a storage element where upon receiving an active edge of a clock signal the storage element transmits the output of the AND gate to a device output.

12. A method of testing a synchronous active low reset scan flip flop, the method comprising:
asserting a test enable input, wherein a serial input and a logic 1 state of the test enable input are received by an AND gate, the AND gate having an output, and causing the output of the AND gate to equal the serial input, the output of the AND gate is received by a multiplexer; and
de-asserting a reset input received by the multiplexer causing the multiplexer to transmit the output of the AND gate to a storage element where upon receiving an active edge of a clock signal the storage element transmits the output of the AND gate to a device output.

* * * * *